United States Patent [19]
Nakamura et al.

[11] Patent Number: 6,069,401
[45] Date of Patent: May 30, 2000

[54] SEMICONDUCTOR CHIP

[75] Inventors: Norihito Nakamura, Kanagawa-ken; Yukihide Nakamoto, Hyogo-ken, both of Japan

[73] Assignee: Kabushiki Kaisha Toshiba, Kawasaki, Japan

[21] Appl. No.: 08/951,590

[22] Filed: Oct. 16, 1997

[30] Foreign Application Priority Data

Oct. 29, 1996 [JP] Japan ..................................... 8-286503

[51] Int. Cl.[7] ................................................. H01L 23/495

[52] U.S. Cl. ......................... 257/676; 257/501; 257/723; 257/725

[58] Field of Search .................................... 257/676, 777, 257/778, 501, 723, 725; 438/928

[56] References Cited

U.S. PATENT DOCUMENTS

| | | | |
|---|---|---|---|
| 3,953,254 | 4/1976 | Valdman | 148/175 |
| 4,888,625 | 12/1989 | Mueller | 257/777 |
| 5,703,405 | 12/1997 | Zeber | 257/777 |
| 5,739,067 | 4/1998 | DeBusk et al. | 438/618 |

*Primary Examiner*—David Hardy
*Attorney, Agent, or Firm*—Banner & Witcoff, Ltd.

[57] ABSTRACT

A system and method for forming semiconductor devices on more than one surface of a chip is disclosed. A bed is formed with separate portions which connect to a first circuit on a first semiconductor face of a semiconductor chip. A second circuit resides on the opposite face of the semiconductor chip. Providing two circuits on separate faces of a semiconductor chip allows for savings of physical area of the chip. By providing a face-to-face contact with a first circuit, heat generated by the first circuit may be drawn away by the bed. Accordingly, smaller semiconductor chips may be realized without excessive heat generation.

15 Claims, 10 Drawing Sheets

SEMICONDUCTOR CHIP

BACKGROUND OF THE INVENTION

1. Technical Overview

The present invention relates to a semiconductor chip and a semiconductor device using the chip. More particularly, the present invention relates to a hybrid semiconductor device having a power portion coupled to a control portion which controls the power portion.

2. Related Art

The prior art includes structures which couple control IC's and power devices (such as IGBTs and the like) together in a single package or unit. Often, the control IC and the power IC require different manufacturing processes. This divergence in manufacturing processes often results in the control IC being manufactured separately from the power IC. Only after completion, the different devices are mounted on a glass epoxy substrate or on a ceramic substrate together with other passive devices (such as resistors, capacitors, and inductors). Alternatively, these devices are accommodated into a single package unit.

FIG. 6 shows an example of the hybrid type semiconductor device, which is formed on a glass epoxy substrate. In this formation, for example plural control-ICs 101 or power devices 102 are mounted on glass epoxy substrate 105 together with the other passive devices 103 and 104.

FIG. 7 shows an example of the hybrid type semiconductor device, which is formed on a thick ceramic substrate. In this formation, for example, plural control-ICs 201 or power chips 202 are mounted on thick ceramic substrate 204 together with the other passive devices 203. In particular, power chip 202 is mounted on the thick ceramic substrate 204 by means of heat sink 205. Bonding wire 206 connects an electrode (not shown) on power chip 202 to a wire (not shown) on thick ceramic substrate 204.

FIG. 8 shows an example of the hybrid type semiconductor device structure, which may be formed into one package unit. In this formation, for example, control chip 304 and power chip 305 are mounted on rivets 302 and 303 in lead frame 301, respectively. These chips 304 and 305 are accommodated in package 306. Also electrodes on the chips 304 and 305 are connected respectively to leads 308 and 309 in lead frame 301 by means of bonding wire 307.

While the above structures of FIGS. 6–8 isolate the control chips from the power chips, one drawback is that the total device size increases by the physical separation of the chips. Also, as the number of parts used in the total structure increase, the reliability and yield of the resulting device decrease as the probability that at least one part will fail increases. In other words, the increase in the number of parts causes the substrate or package size to increase. In addition to preventing miniaturization, the additional parts increase the amount of wiring, while decreasing the end device's reliability and the yield.

Another effect of the increase in the amount of wiring due to the increase in the number of parts is a deterioration in the anti-noise characteristics of the device. While deterioration of the anti-noise characteristics of the device may be rectified by providing, for example, a by-pass capacitor, adding a capacitor further increases the number of devices (which may not be directly a cause of noise) which, in turn, causes further problems such as increasing the size of the device or decreasing the end device's reliability.

Similar problems exist when combining two divergent systems such as a memory device and a controller for controlling the memory device. For example, a flash memory is generally formed of one process while a controlling circuit is formed through a different process. Accordingly, it is difficult to readily combine the two circuits onto a single chip as the processes for forming the different circuits may be incompatible.

One solution to minimizing the size of packages is to combine two device portions onto a single hybrid chip. For example, if a control device portion and a power device portion are formed by non-conflicting processes, enabling different functions on one integrated chip (for example, low voltage control compared to high current modulation), then a hybrid chip may be produced.

FIG. 9 shows a hybrid chip structure. In this structure, control and power device portions 402 and 403 are formed in an array and integrated on chip 401. Insulating layer 404 separates chip substrate 401, device portion 402, and device portion 403.

While the structure of the hybrid chip of FIG. 9 is compact, there is a high possibility for detrimental fluctuations in the device characteristics and the chip rack due to excess heat. In particular, the side by side nature of the two devices enlarges the size of the resulting device while not correspondingly increasing the device's heat dissipating ability. Thus, because this structure integrates device portions in an array on a chip, the chip may easily suffer heat stress as the device's size increases. Accordingly, resulting problems include the total device size increasing while degrading reliability, even in the case where a hybrid semiconductor device is formed by employing an integrated chip, in which device portions are integrated in an array on the chip.

As described above, problems arise when conventional devices are combined such as when the sizes of the devices increase, the reliability decreases. Thus, an object of the present invention is to provide a hybrid semiconductor device, which may be miniaturized and still obtain a high reliability.

SUMMARY OF THE INVENTION

To achieve the above object, a semiconductor chip according to the present invention includes a structure wherein first and second semiconductor layers are provided in upper and lower directions by inserting an insulation layer between the first and second layers. First and second integration circuit portions are provided in the first and second semiconductor layers, respectively.

Also, a semiconductor device formed according to the present invention may include a structure wherein a semiconductor chip comprises the first and second semiconductor layers, which are provided in upper and lower directions by inserting at least one insulation layer between the two, first and second integration circuit portions formed on the first and second semiconductor layers, respectively, at least one bed to which each electrode terminal for the first integration circuit portion is connected, and at least one lead frame having at least one leads to which each electrode terminal for the second integration circuit portion is connected.

Further, a semiconductor device formed according to the present invention comprises a semiconductor chip which is formed by bonding a first semiconductor device and a second semiconductor device together, the first semiconductor device having a first semiconductor layer, where a first integration circuit portion is formed, and the second semiconductor device having the second semiconductor layer where a second integration circuit portion is formed, providing at least one bed to which at least one electrode terminal is connected by separating beds into plural portions depending on the positions where each electrode terminal appears on the first integration circuit portion of the semiconductor chip, bonding the first integration circuit portion to the separated beds with a conductive adhesive, forming a lead frame having leads to which each electrode terminal of the second integration circuit portion is individually connected by means of at least one bonding wire, and encasing encases the semiconductor chip in a resin, except for a part of at least one lead from the lead frame.

A semiconductor chip according to the present invention may achieve the form of an integrated semiconductor chip formed by different manufacturing processes and exhibiting various functions. Accordingly, a semiconductor circuit according to the present invention prevents the chip size from increasing, while preventing fluctuations in device characteristics and the occurrence of chip rack due to heat stress.

Moreover, the semiconductor device according to the present invention may be miniaturized corresponding to semiconductor chip sizes, so that simplified mounting may be achieved.

DETAILED DESCRIPTION

Figure 1:
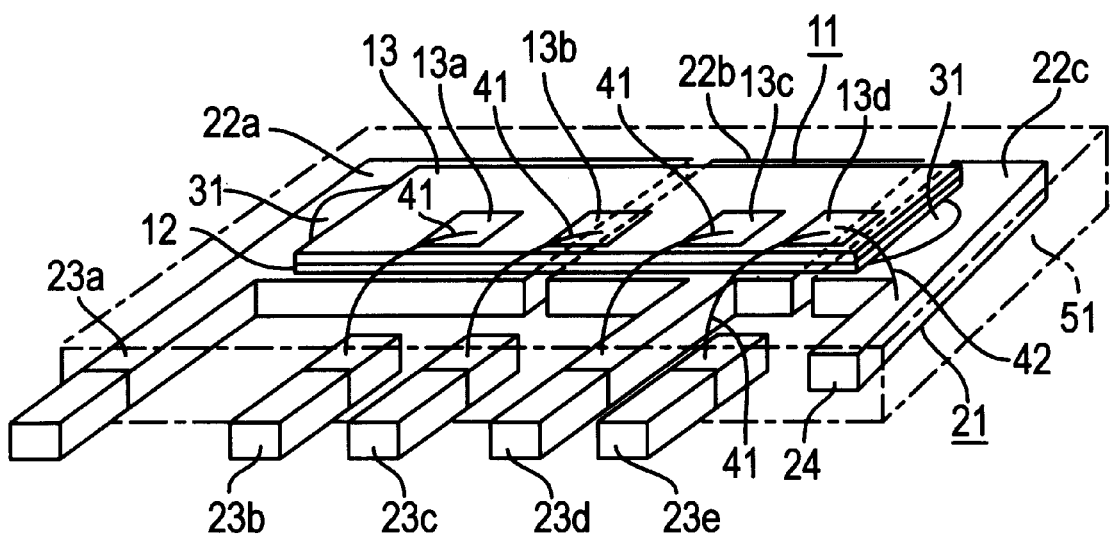
FIG. 1 is a view showing an interior package according to embodiments of the present invention, illustrating a hybrid semiconductor device structure.

An embodiment of the present invention will be explained referring to drawings. FIG. 1 shows an outline of a hybrid type semiconductor device structure, which is made according to the embodiments of the present invention.

The hybrid type semiconductor device has a structure wherein a power device portion (first integration circuit) 12, such as an IGBT formed on the main plane of semiconductor chip 11, is bonded to individual beds 22a, 22b and 22c on lead frame 21. The separation of the beds is determined by the positions of individual electrode terminals C, E, and G on the power device portion 12. Power device portion 12 is attached to the beds using conductive adhesive 31 (such as conductive paste and solder paste).

The hybrid type semiconductor device has a structure wherein individual electrode terminals (for example, $V_{CC}$, IN, GND(E), OUT) 13a, 13b, 13c and 13d on control device portion 13 (second integration circuit portion) are formed on the other main plane of the semiconductor chip 11. These terminals are connected to external connection leads 23b, 23c, 23d, 23e on the lead frame 21 by means of bonding wires 41 except for external connection lead 23a.

Also, the hybrid type semiconductor device has a structure wherein the semiconductor chip 11 periphery is sealed with resin mold package 51. The package includes each connection portion of external connection leads 23b to 23e, bonding wires 41, and internal connection lead 24 (connected to the bed 22c). Also, the heads of the external connection leads 23a to 23e are exposed for connection. In this case, the internal connection lead 24, which is not used for external connections, is accommodated within package 51. Its existence improves the anti-surge and anti-noise characteristics of the device.

Moreover, electrode terminal (OUT) 13d for control device portion 13 is connected to internal connection lead 24 by means of bonding wire 42, so that the power device portion 12 and control device portion 13 may be electrically connected. To this end, external connection lead 23a may be connected to the bed 22a and external connection lead 23d may be connected to the bed 22b.

Figure 2:
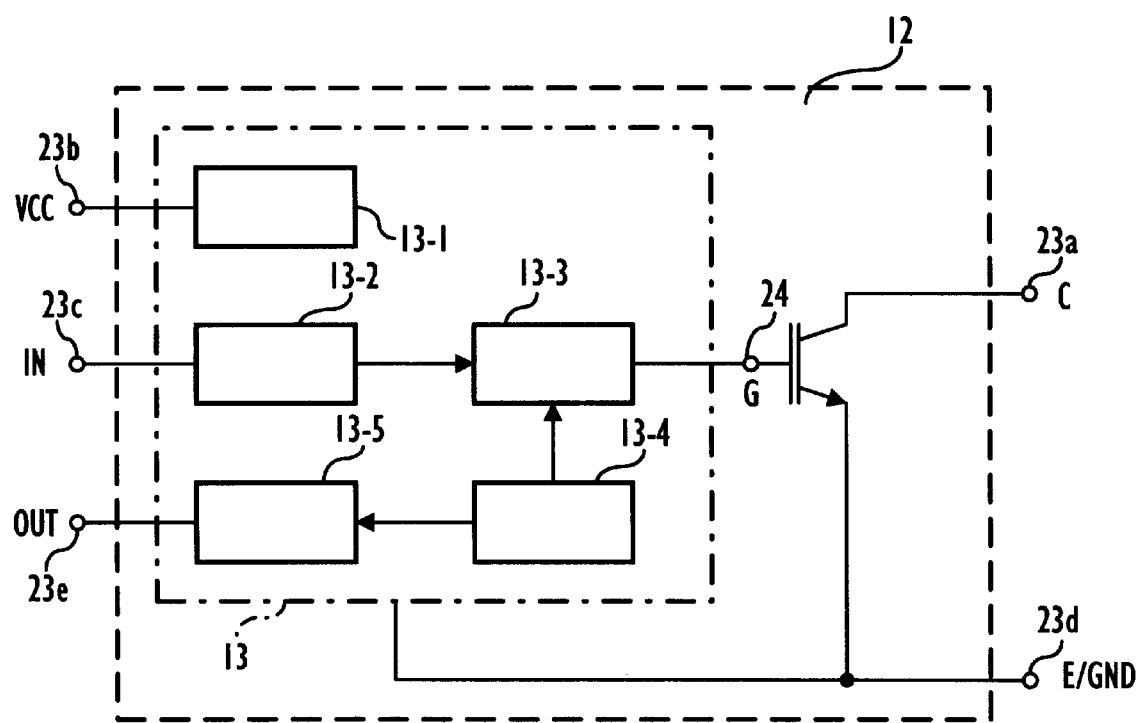
FIG. 2 is a block diagram showing one example of a schematic diagram of the hybrid semiconductor device according to embodiments of the present invention.

FIG. 2 shows an equivalent structure for the hybrid type semiconductor device, wherein power device portion 12 is formed with the IGBT, as an example. In this case, control device portion 13 which controls IGBT may include, for example, power circuit 13-1 (to which power (VCC) for operation is supplied from external connection lead 23b), input circuit 13-2 (to which an operating signal (IN) is input from external connection lead 23c), driving circuit 13-3 (to drive the IGBT with an ON (HIGH) output from input circuit 13-2), protection circuit 13-4 (to protect driving circuit 13-3), and dialog circuit 13-5 (to monitor protection circuit 13-4 and to output error signal (OLTT) to external connection lead 23e, as a result of any abnormal operation).

Further, driving circuit 13-3 is connected by means of the internal connection lead 24 to gate G of the IGBT bonded on the bed 22c. An IGBT collector C is connected to external connection lead 23a and connected to the bed 22a. An IGBT emitter E is connected to the external connection lead 23d and connected to the bed 22b. Bed 22b is also used for supplying ground potential (GND) to the control device portion 13. While not shown for simplicity, leads 23c and 23e may be connected to a microprocessor for control.

Figure 3A:
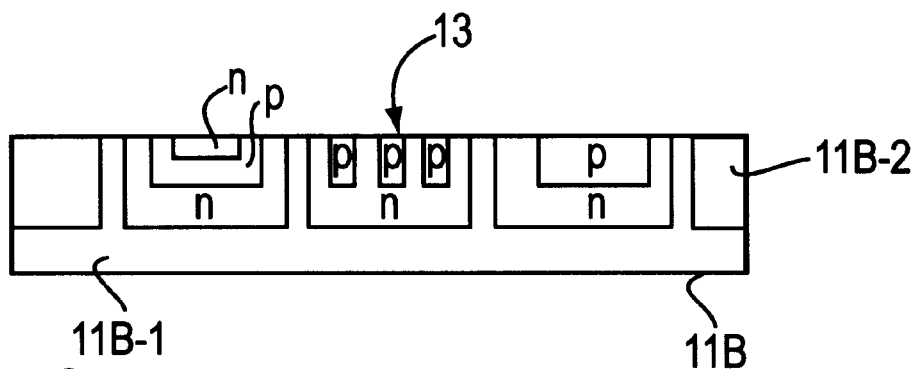
FIGS. 3A–C are sectional views schematically showing a semiconductor chip structure according to embodiments of the present invention.
Figure 3B:
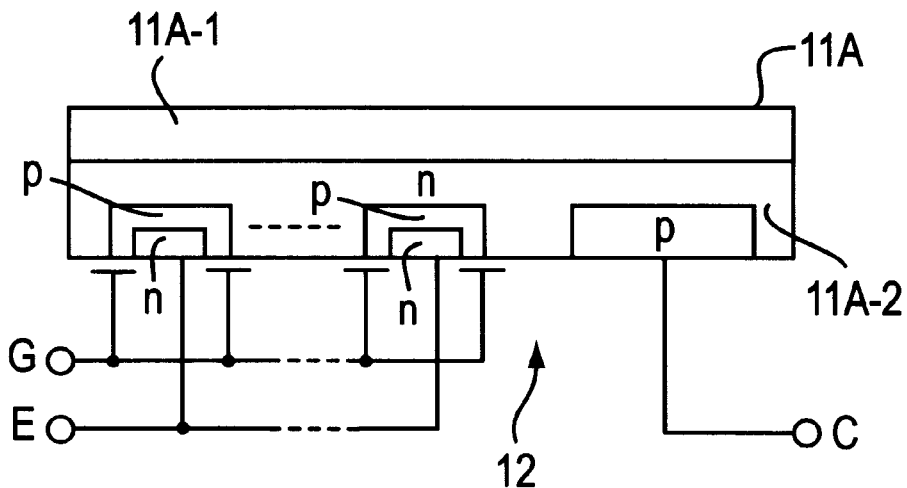
Figure 3C:
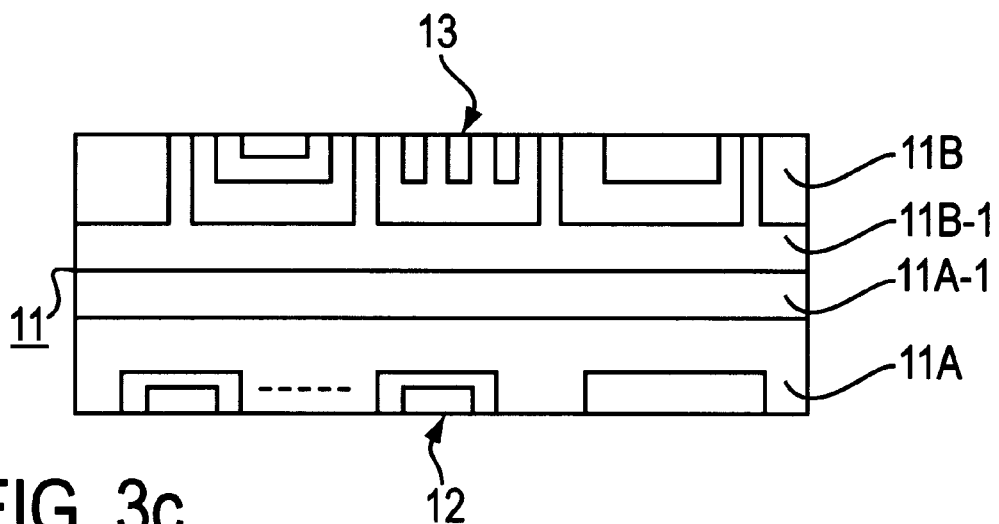

FIG. 3 shows a detailed structure for the semiconductor chip 11. Semiconductor chip 11 includes semiconductor device 11A, in which power device portion 12, such as the IGBT, is formed with up-drain structure. An up-drain structure is one in which a drain is in the same plane as other elements. Semiconductor chip 11 also includes semiconductor device 11B in which control device portion 13 is formed with a dielectric isolation structure. To form semiconductor chip 11, semiconductor devices 11A and 11B are bonded on the rear side of dielectric layers (insulating layer) 11A-1 and 11B-1.

The structures of FIG. 3 may be formed by forming trenches in a semiconductor substrate. The trenches are then filled with $SiO_2$. Next, the remainder of the original semiconductor may be removed, for example, via grinding. The remaining chip is inverted to reveal islands of Si on a substrate of $SiO_2$.

As shown in FIG. 3a, the semiconductor device 11B structure is such that control devices, such as an NPN-TR, PNP-TR, and a resistor are formed on the surface of each semiconductor layer 11B-2 separated by dielectric layer 11B-1, thereby forming the control device portion 13 as a second integration circuit portion.

As shown in FIG. 3b, the semiconductor device 11A structure is such that a power stage, such as the IGBT, is formed with up-drain structure on the surface of semiconductor layer 11A-2 formed on dielectric layer 11A-1, thereby forming the power device portion 12 as a first integration circuit.

In such a structure as that described above, semiconductor chip 11 is formed so that control and power device portions 13 and 12 are accumulated on the lower surface of dielectric layer 11A-1 and on the upper surface of dielectric layer 11B-1, respectively. Combining the two layers, the size of chip 11 may be miniaturized to about a half the size of a conventional chip where the conventional chip joins the two portions in an array. In the example of power circuits, the applied thickness of the insulating layers may vary with the powered device. For example, with a 450 V power circuit, at least 3 microns of $SiO_2$ may be used to block the heat radiating from the power circuit to the control circuit. Similarly, with a 600 V power circuit, at least 4 microns of $SiO_2$ may be used. Also, with a 750 V power circuit, at least 5 microns of $SiO_2$ may be used.

Therefore, the structure according to the present invention may improve the problems of being easily affected by heat stress and the high probability of causing fluctuation in characteristics and chip rack. In one example, this is done by moving the heat generating portions of a device to the outside of the completed chip where a heat sink may be located to remove the unwanted heat.

Figure 4:
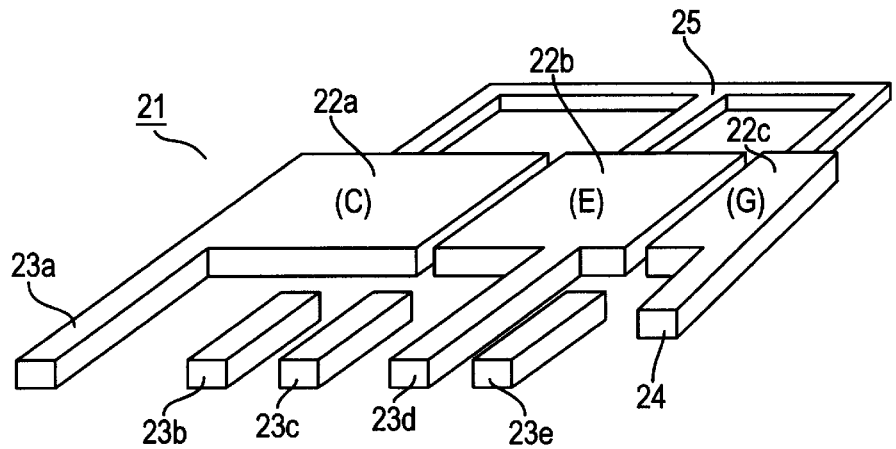
FIG. 4 is a view showing a lead frame structure according to embodiments of the present invention.

FIG. 4 shows a further detailed structure of the lead frame 21, wherein a part of the description for a tie bar which combines leads from other structures, is omitted for convenience.

Lead frame 21 comprises beds 22a, 22b, and 22c. These beds 22a, 22b and 22c are separated depending on the positions of individual electrode terminals (for example, C, E, and G for the IGBT) on the power device portion 12. The lead frame also includes external connection leads 23a, 23b, and 23c and internal connection lead 24. External lead 23a, among the external connection leads 23a to 23e, is connected to bed 22a, forming one united portion. In addition, external connection lead 23d is connected to the bed 22b, forming one united portion. Further, external connection leads 23b, 23c, and 23e are provided independent of individual beds 22a, 22b and 22c. The internal connection lead 24 is connected to the bed 22c, forming one united portion. Internal connection lead 24 is provided shorter than each of the external connection leads 23a to 23e so that it does not project from within the package 51.

In such a structure, power device portion 12 is bonded on beds 22a, 22b, and 22c of lead frame 21, thereby automatically connecting the IGBT collector to external connection lead 23a, and the IGBT emitter to external connection lead 23d, and the IGBT gate to internal connection lead 24.

Bed 22a may be constructed to a larger size so as to remove more heat generated by IGBT. Also, bed 22a may be thicker than the other beds so as to increase its heat dissipating ability. So as to conserve space, bed 22c may be minimized as it is not needed to sink as much heat as the other beds (22a and 22b).

Furthermore, it is desirable to determine the separation ratio for beds 22a, 22b, and 22c, considering current capacity and heat radiation, such as C>E>>G. Also, to further keep the rest of the device cool, lead 23a is spaced from the other leads to prevent heat radiation to other leads 23b, 23c, 23d, and 23e.

Figure 5:
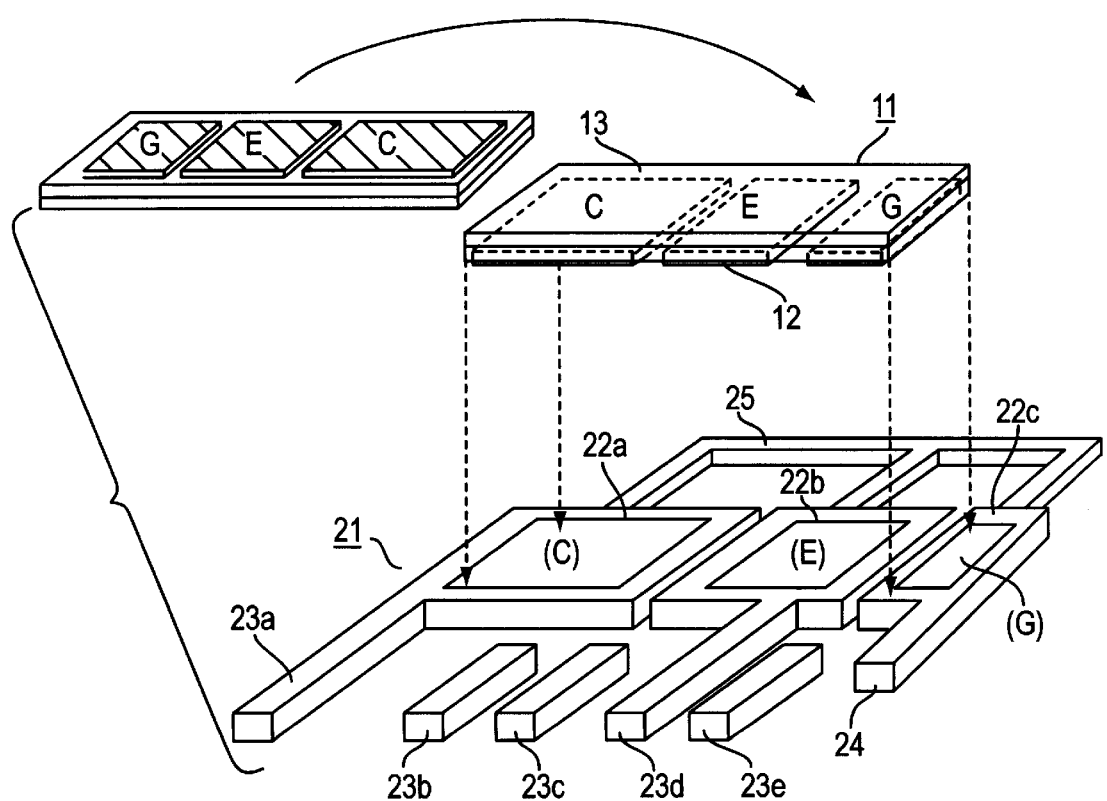
FIG. 5 is a view illustrating a portion of a manufacturing process for manufacturing the hybrid semiconductor device according to embodiments of the present invention.
Figure 6:
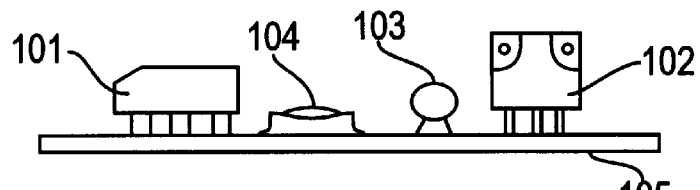
FIG. 6 is a cross-sectional view showing a conventional semiconductor device formed with a glass epoxy substrate.
Figure 7:
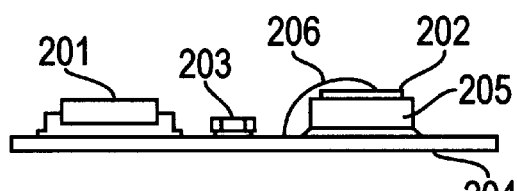
FIG. 7 is a cross-sectional view showing a conventional semiconductor device formed with ceramic substrate.
Figure 8:
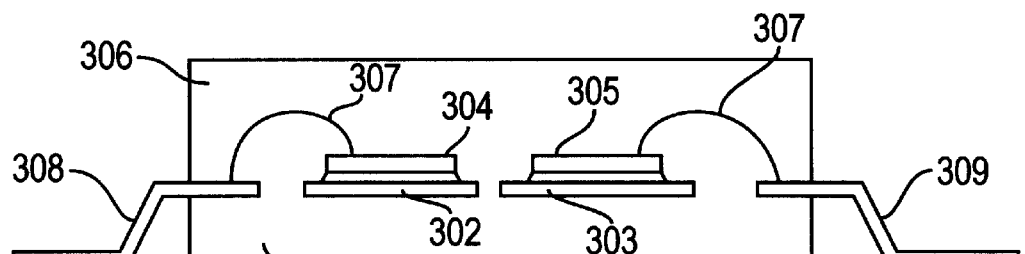
FIG. 8 is a cross-sectional view showing a single package semiconductor device structure.
Figure 9:
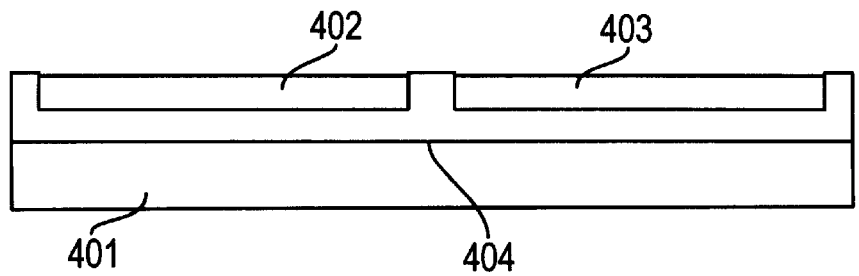
FIG. 9 is a cross sectional view showing a conventional semiconductor chip structure.

FIG. 5 shows a method for mounting semiconductor chip 11 on the lead frame 21. First semiconductor chip 11 is formed. For example, the formation as shown in FIG. 3 may be used. Next, semiconductor chip 11 is mounted on lead frame 21, so that power device portion 12 of semiconductor chip 11 faces lead frame 21. When aligned, the IGBT collector and emitter correspond to beds 22a and 22b, respectively. Power device portion 12 is bonded individually to beds 22a, 22b and 22c, thereby, electrically connecting the IGBT collector to external connection lead 23a, the IGBT emitter to external connection lead 23d, and the IGBT gate to internal connection lead 24. Subsequently, parts of semiconductor chip 11 and lead frame 21 are accommodated within package 51, such as sealing resin, and then tie bar 25, combining beds 22a, 22b, and 22c to each other, is cut. As a result, the process may be simplified because no wire bonding is required for connecting the beds to each other. Thus, the reliability and the yield related to bonding may also be improved.

As described above, bonding the rear dielectric layer surface to each other enables forming a semiconductor chip in a single chip size, having control and power device portions. Accordingly, am "on-silicon" formation becomes possible for a hybrid system, where control and power device portions are combined, thereby greatly miniaturizing chip size and preventing fluctuations in characteristics and chip rack due to heat stress from occurring.

That is, a hybrid type semiconductor device may be miniaturized according to semiconductor chip sizes. In addition, the mounting process may be greatly simplified, so that the reliability and the yield may be improved.

Moreover, in the embodiment of the present invention as described above is explained by using the IGBT as a power device portion. However, the embodiment may also be applied to various switching devices, for example, bipolar transistor and MOS transistor.

Figure 10:
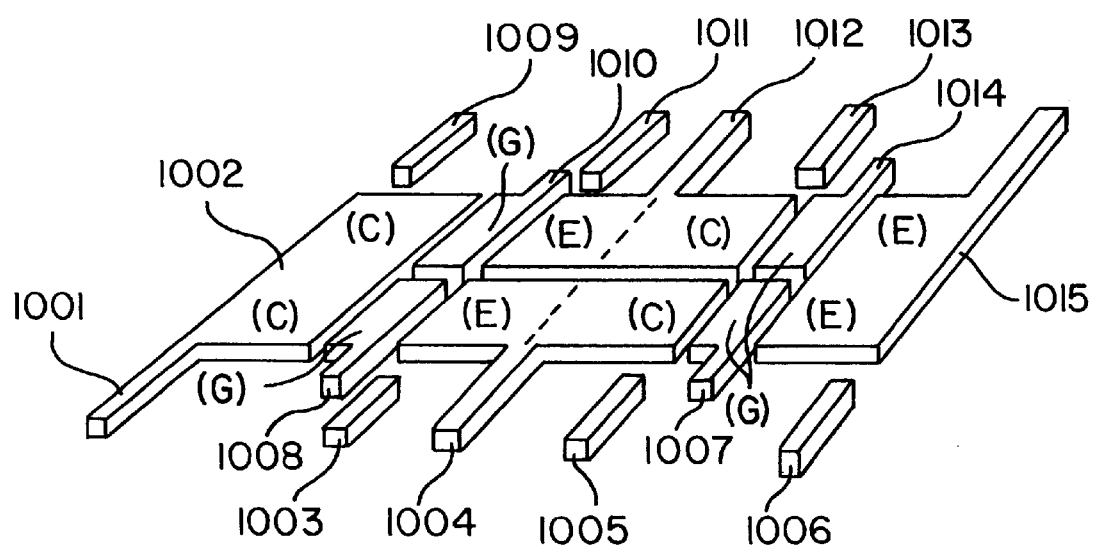
FIG. 10 is a view of a lead frame structure according to embodiments of the present invention.

Further, a power device portion is not limited to the one comprising a single IGBT. For example, a half bridge type driver, comprising two IGBTs, an H-bridge type driver comprising four IGBTs, or an inverter comprising six IGBTs, may also be applied. An example of a multiple IGBT bed is shown with respect to FIG. 10. FIG. 10 shows a bed similar to that of FIG. 4. The bed includes collector lead portion 1001 (connected to bed 1002). (For simplicity, the bed and lead portions for FIG. 10 are used interchangeably.) The bed also includes lead 1009, leads 1008, 1010, 1007, and 1014 connected to the gates of mounted IGBTs. Bed 1015 connects to the emitter of two IGBTs. Beds 1004 and 1012 interconnect the collectors and emitters of the four IGBTs (in pairs). Leads 1003, 1005, 1013, and 1011 may be connected as described above with bonding wires.

Figure 11:
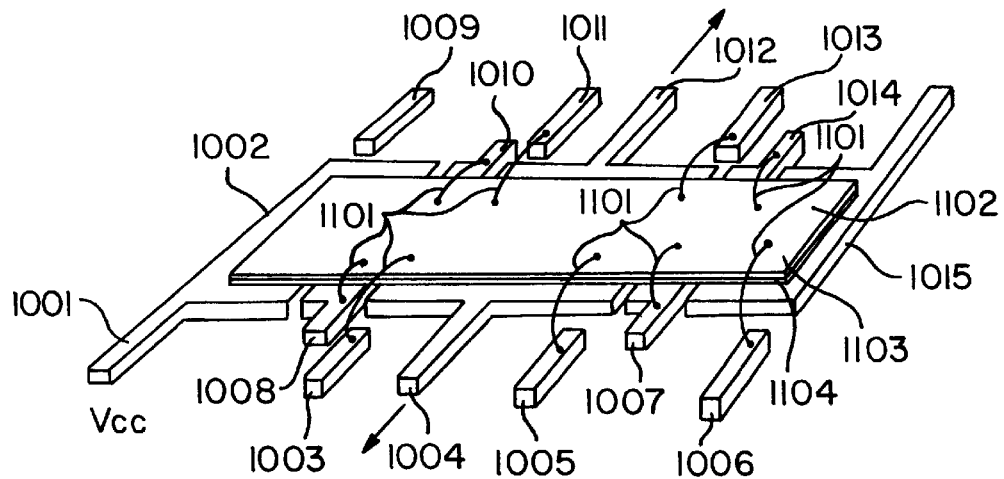
FIG. 11 is a view of the lead frame structure of FIG. 10 with a hybrid semiconductor chip according to embodiments of the present invention.

FIG. 11 shows the beds of FIG. 10 connected to a single circuit 1102 comprising a control circuit in layer 1103 and the four IGBTs in layer 1104. Bonding wires 1101 interconnect the various elements and terminals as required.

Figure 12:
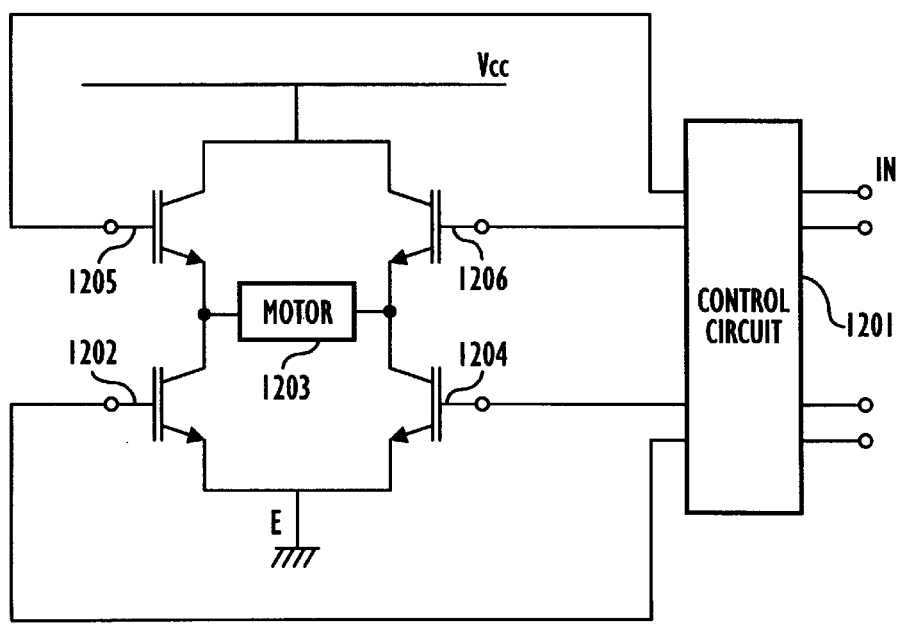
FIG. 12 is a schematic diagram of an example of an application of the lead structure of FIG. 11 according to embodiments of the present invention.

FIG. 12 shows an example of the bed and semiconductor chip combination of FIG. 11 controlling a motor. In this example, motor 1203 is a bi-directional motor. IGBTs 1202, 1204, 1205 and 1206 control the direction of rotation of the motor. When IGBTs 1206 and 1202 are on, motor 1203 rotates in a first direction. When IGBTs 1205 and 1204 are on, motor 1203 rotates in the opposite direction. Control circuit 1201 controls the IGBTs 1202, 1204, 1205, and 1206. Control circuit 1201 may be controlled by a microprocessor (not shown).

Figure 13:
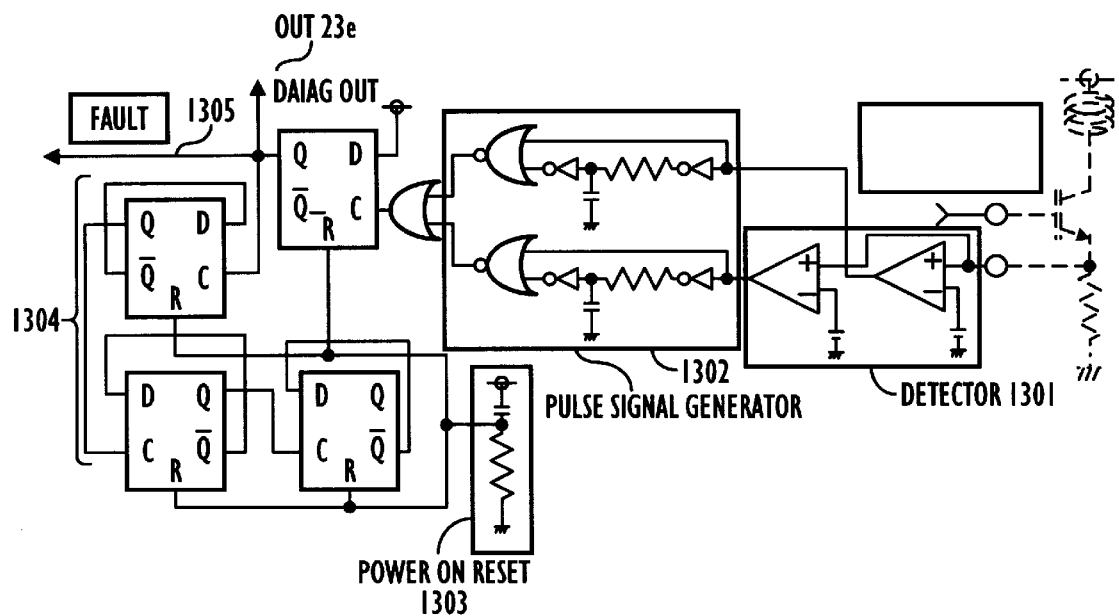
FIGS. 13–16 are schematic diagrams of the circuits FIG. 2 according to embodiments of the present invention.

FIG. 13 shows an embodiment of protection circuit 13-4 and dialog circuit 13-5. Detector 1301 includes two comparators. When activated, the outputs of the comparators signal pulse signal generator 1302 to generate a pulse output. The pulse output of the pulse signal generator 1302 is fed into flip-flop array 1305. The output of the flip-flop array is output via line 1305. Finally, power-on-reset 1303 resets the flip-flop array 1304 when the power is turned cycled.

Figure 14:
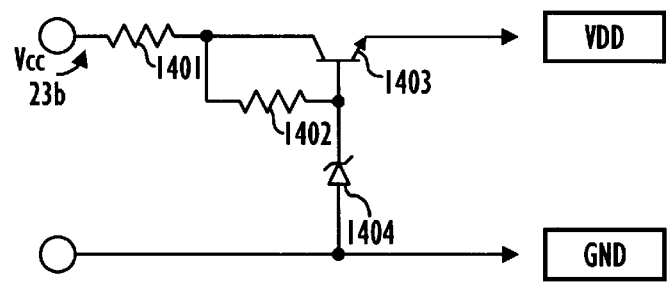

FIG. 14 shows power circuit 13-1. $V_{CC}$ is applied to one terminal of resistor 1401. The other terminal of resistor 1401 is connected to both the collector of transistor 1403 and to resistor 1402. The other terminal of 1402 is connected to diode 1404 and to the gate of transistor 1403. The other terminal of diode 1404 is connected to ground. The emitter of transistor 1403 supplies $V_{DD}$ to the rest of the circuit.

Figure 15:
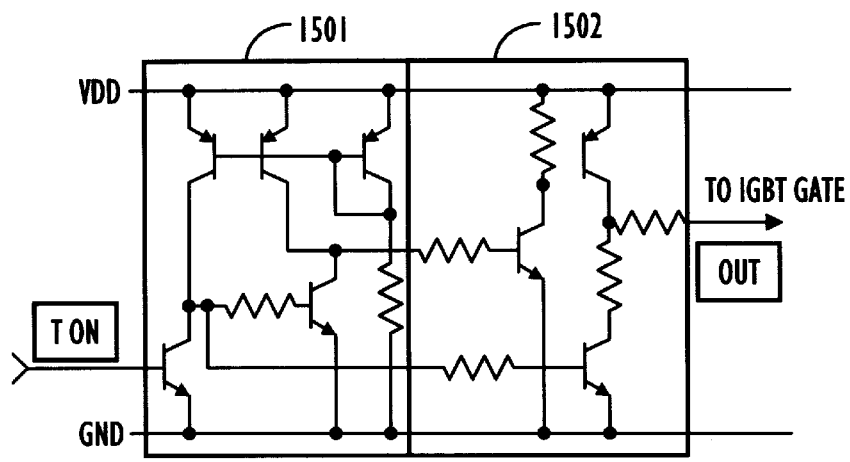

FIG. 15 shows driving circuit 13-3. Receiving the output of 13-2, the input stage 1501 provides a driving signal to output stage 1502 which then provides a high current, for example, signal to the gate of IGBT 24.

Figure 16:
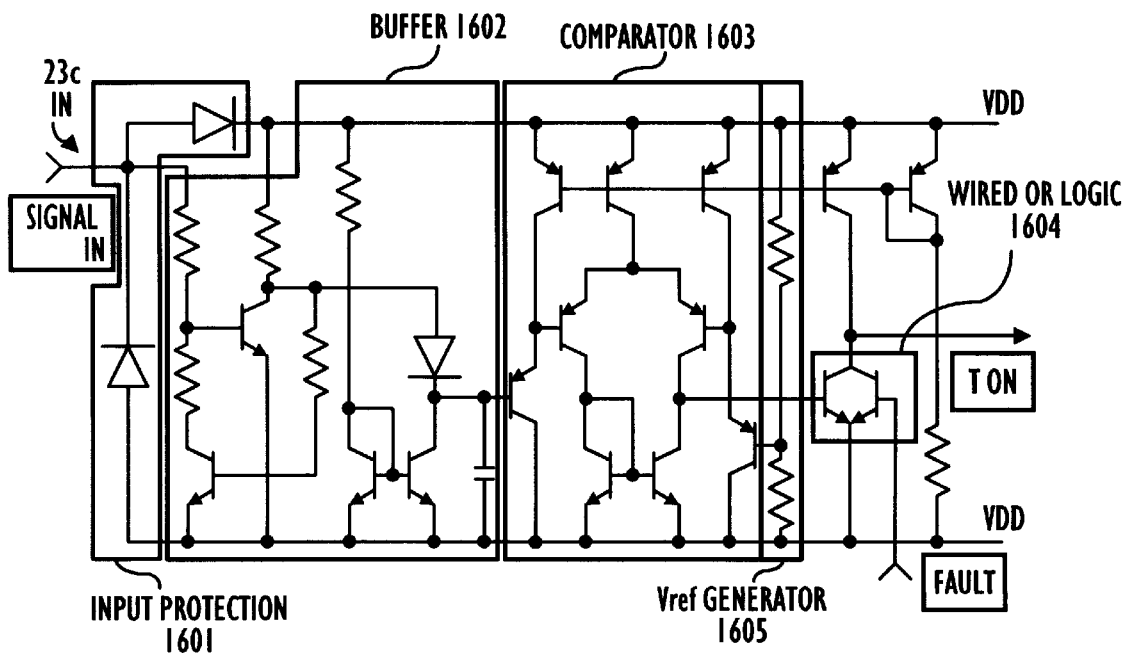

FIG. 16 shows input circuit 1302. Receiving an input signal 23c in the input protection stage 1601, the signal is buffered through buffer 1602, compared in comparator 1603 against a reference voltage generated by $V_{REF}$ generator 1605. The output of comparator 1603 is passed through wired OR logic 1604 where it is compared with a fault signal. The output of the wired OR logic is then output as T ON.

Figure 17:
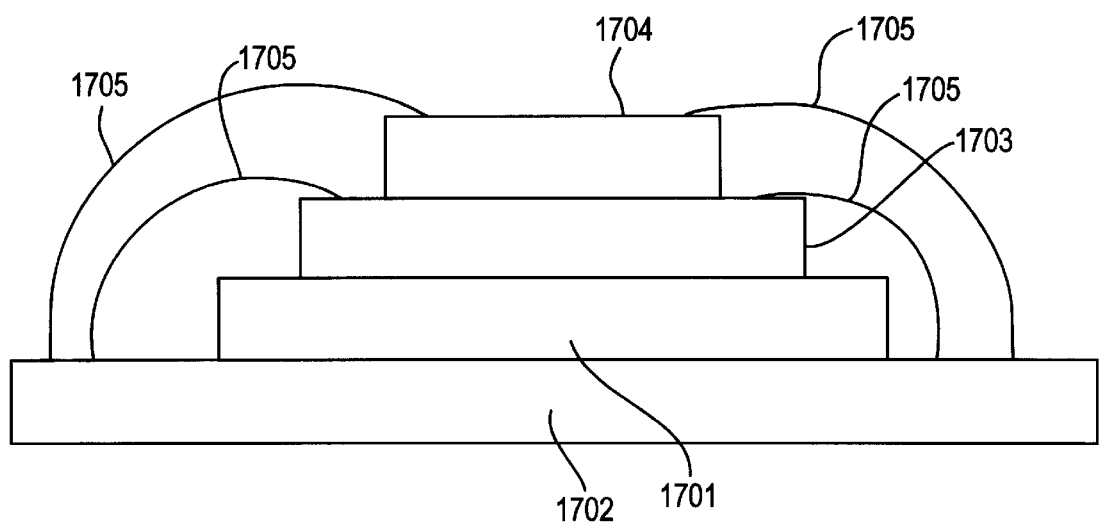
FIG. 17 shows an alternative embodiment of the invention using three layers of circuits.

FIG. 17 shows an alternative embodiment of the invention with a power circuit 1701 connected to bed 1702. On top of power circuit 1701 is control circuit 1703. On top of control circuit is another control circuit 1704. Control circuit 1703 is chosen so as to minimize heat generation as it is placed between two other circuits. Bonding wires 1705 are used as needed.

A variety of alternatives exist to the embodiments described above. For example, the sides of a control device portion may also be bonded to each other, although the sides of a semiconductor chip power device portion (generally having fewer electrode terminals than those for the control device portion) may be bonded to each other in the above embodiment, considering heat radiation and the number of separate beds.

In addition, an adhesive may be used to connect the power device portion to the bed in the above embodiments. Alternatively, it is also possible to connect the two elements with wire bonding, for example, by forming openings on the beds.

Further, the embodiments of the present inventions may be applied to various fields requiring, for example, miniaturization of chip sizes and greater integration, in addition to a hybrid type semiconductor device field. For example, a memory array with a controlling may be used where the memory array takes the place of the power circuit in the above examples. Examples of memory devices include flash memory, dynamic memory, static memory, and other semiconductor memories, etc.

The invention is not restricted to the embodiment conditions as described above, but can, of course, be implemented in various variable ways, considering the number of ways in the formation range, without parting from the scope of the invention. As described above, the present invention may provide a hybrid type semiconductor device, which enables miniaturization and has high reliability. Thus, while the present invention has been particularly described with reference to the preferred embodiments, it should be readily apparent to those of ordinary skill in the art that changes and modifications in form and details may be made without departing from the spirit and scope of the invention. It is intended that the appended claims include such changes and modifications.

We claim:

1. A semiconductor chip comprising:
   a semiconductor substrate having a first surface and a second surface, which is opposite to the first surface;
   a first active device formed on the first surface;
   a second active device formed on the second surface; and
   an insulator film formed between the first active device and the second active device;
   wherein said first active device is a power device and at least one electrode of said power device faces a lead frame, thereby said lead frame performs as a heat sink for a heat generated by said power device.

2. The semiconductor chip according to claim 1, wherein the second active device is a control circuit.

3. The semiconductor chip according to claim 1, wherein the second active device controls the power circuit.

4. A semiconductor device comprising:
   lead frame having separate beds and inner leads, said separate beds having at least one planar contact area;
   a semiconductor chip having a first surface with at least one planar contact area and an opposite second surface, the first surface facing and being in electrical contact with the separate beds through contact between said at least one planar contact area of said first surface and said at least one planar contact area of said beds, said lead frame transferring heat from said first surface, and the second surface being in electrical contact with the inner leads through bonding wires, wherein an insulator film is interposed between a first semiconductor body of the first surface and a second semiconductor body of the second surface;
   first active device formed on the first surface; and
   second active device formed on the second surface.

5. The semiconductor device according to claim 4, wherein the first active device is an IGBT.

6. The semiconductor device according to claim 5, wherein a collector bed connected to a collector electrode of the IGBT is the largest among the separate beds.

7. The semiconductor device according to claim 4, further comprising a resin covering the semiconductor chip.

8. A semiconductor device comprising:
   an IGBT on a first face of a semiconductor chip; and,
   a controller on a second face of the semiconductor chip.

9. A semiconductor device comprising:
   an up-drain circuit on a first face of a semiconductor chip;
   a controller circuit controlling the operation of said up-drain circuit, said controller circuit located on a second face of the semiconductor chip, and an insulator film formed between the first face and the second face, wherein said up-drain circuit forms part of a power device and at least one electrode of said up-drain circuit faces a lead frame, thereby said lead frame performs as a heat sink for heat generated by said up-drain circuit.

10. A semiconductor device comprising:

a semiconductor chip with a first face;

a module on said first face, said module having at least two contact portions;

a bed comprising at least two selections;

wherein said first face is mounted to said bed and said at least two contact portions contact said at least two sections, respectively, and wherein said module is an IGBT module.

11. The semiconductor device according to claim 10, further comprising:

at least three additional IGBT modules on said first face;

wherein said bed including additional sections which contact terminals of said IGBT modules.

12. The semiconductor device according to claim 10, further comprising a resin covering the semiconductor chip.

13. A method for forming a semiconductor device comprising the steps of:

providing a lead frame in a bed with at least two sections;

providing a power device on a semiconductor chip with at least one electrode on a first surface of said chip, wherein said semiconductor chip has a second surface opposite to the first surface and a control circuit for controlling the power device is formed on the second surface;

mounting said semiconductor chip so that said electrodes of said power device are in a face-to-face contact with said bed, so that said bed performs as a heat sink for heat generated by said power device.

14. The method for forming a semiconductor device according to claim 13, further comprising the steps of:

connecting said electrodes of the control circuit to said lead frame with bonding wire.

15. The method for forming a semiconductor device according to claim 13, further comprising the steps of:

molding the semiconductor chip with a resin.

* * * * *